United States Patent
Meder et al.

(10) Patent No.: US 6,440,852 B1
(45) Date of Patent: Aug. 27, 2002

(54) INTEGRATED CIRCUIT INCLUDING PASSIVATED COPPER INTERCONNECTION LINES AND ASSOCIATED MANUFACTURING METHODS

(75) Inventors: Martin G. Meder, Catasauqua, PA (US); Sailesh Mansinh Merchant, Orlando, FL (US); Michael Louis Steigerwald, Martinsville; Yiu-Huen Wong, Summit, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/364,858

(22) Filed: Jul. 30, 1999

Related U.S. Application Data

(60) Provisional application No. 60/117,186, filed on Jan. 26, 1999.

(51) Int. Cl.[7] .................................................. H01L 21/44
(52) U.S. Cl. ............................ 438/687; 438/768; 438/958
(58) Field of Search .................................. 438/636, 652, 438/658, 659, 678, 679, 680, 687, 768, 958, 783; 257/650, 762, 767

(56) References Cited

U.S. PATENT DOCUMENTS

| | | | |
|---|---|---|---|
| 4,560,826 A | 12/1985 | Burns et al. .................. 174/52 |
| 5,149,378 A | * 9/1992 | Ohmi et al. ................. 118/725 |
| 5,431,774 A | 7/1995 | Douglas ....................... 216/57 |
| 5,567,244 A | * 10/1996 | Lee et al. ...................... 134/3 |
| 5,654,245 A | 8/1997 | Allen .......................... 438/629 |
| 5,736,002 A | 4/1998 | Allen et al. .................. 156/628 |
| 5,751,056 A | 5/1998 | Numata ....................... 257/666 |
| 5,876,798 A | 3/1999 | Vassiliev ................. 427/255.3 |
| 5,880,024 A | 3/1999 | Nakajima et al. ........... 438/669 |
| 5,882,983 A | 3/1999 | Gardner et al. ............. 438/424 |
| 5,908,672 A | 6/1999 | Ryu et al. ................... 427/574 |
| 5,909,637 A | 6/1999 | Charneski et al. .......... 438/687 |
| 6,297,554 B1 | * 10/2001 | Lin ............................. 257/752 |

* cited by examiner

*Primary Examiner*—Olik Chaudhuri
*Assistant Examiner*—Ginette Peralta
(74) *Attorney, Agent, or Firm*—Allen, Dyer, Doppelt, Milbrath & Gilchrist, P.A.

(57) ABSTRACT

An integrated circuit includes a substrate, and at least one copper interconnection layer adjacent the substrate. The interconnection layer further comprises copper lines, each comprising at least an upper surface portion including at least one copper fluoride compound. The copper fluoride compound preferably comprises at least one of cuprous fluoride and cupric fluoride. The compounds of copper and fluoride are relatively stable and provide a reliable and long term passivation for the underlying copper. In accordance with one particularly advantageous embodiment of the invention, the dielectric layer may comprise a fluorosilicate glass (FSG) layer. Accordingly, during formation of the FSG layer, the upper surface of the copper reacts with the fluorine to form the copper fluoride compound which then acts as the passivation layer for the underlying copper. In other embodiments, the dielectric layer may comprise an oxide or air, for example. In yet other embodiments, the copper line may include prefluorinated portions so as to avoid fluorine depletion of adjacent FSG layer portions.

25 Claims, 5 Drawing Sheets

INTEGRATED CIRCUIT INCLUDING PASSIVATED COPPER INTERCONNECTION LINES AND ASSOCIATED MANUFACTURING METHODS

RELATED APPLICATION

This application is based upon prior filed copending provisional application No. 60/117,186 filed Jan. 26, 1999, the entire disclosure of which is incorporated herein by reference.

FIELD OF THE INVENTION

The present invention relates to semiconductor devices and, more particularly, to an integrated circuit including copper interconnections.

BACKGROUND OF THE INVENTION

Semiconductor devices in the form of integrated circuits are widely used in many electronic devices. A typical integrated circuit includes a substrate, active regions formed in the substrate, and one or more conductive interconnection layers on the substrate. Each interconnection layer typically includes a plurality of closely spaced metal or conductive lines. These conductive lines connect active portions on the substrate, and provide for external connections to the active circuit portions.

Dielectric layers, also known as inter-level dielectric (ILD) layers, typically formed of silicon dioxide, separate adjacent interconnection layers. The metal lines of vertically spaced interconnection layers may be connected by vertically extending vias.

Increasing performance demands for integrated circuits have resulted in greater circuit densities. Accordingly, device sizes are being continually reduced. Reduced signal propagation delays are also desired. The cross-sectional area of interconnections has been decreased as circuit densities increase. Unfortunately, an increase in the interconnection resistance and stray capacitance degrades signal propagation speed.

A number of interconnection materials have been used including polysilicon and aluminum, for example. For increased conductivity, silicided polysilicon, aluminum, and tungsten are also now more commonly used for the interconnections. Large current densities in small cross-sectional aluminum interconnections, for example, may lead to electromigration, and voiding. Aluminum has been alloyed with small proportions of copper to enhance electromigration resistance. Tungsten, for example, has good electromigration resistance, but has a relatively high electrical resistance. Copper, in comparison, has both good electromigration resistance and a relatively low electrical resistivity of about 1.7 $\mu$ohm·cm. Unfortunately, copper is relatively quick to oxidize especially during processing or manufacturing of the integrated circuit.

Passivation techniques have been attempted to reduce or prevent the oxidation of the upper surface of copper interconnections. Silicon dioxide has been used as the passivating layer, but has a tendency to oxidize the copper. An alternate approach is to form a silicon nitride passivating layer on the exposed upper surface of the copper during manufacturing. Yet another approach is to form a phosphosilicate glass passivation layer on the copper interconnection.

Existing passivating techniques may be unsatisfactory. In addition, the passivating layers, such as silicon nitride or phosphosilicate glass may have relatively high dielectric constants. These high dielectric constants cause increased signal propagation delays.

SUMMARY OF THE INVENTION

In view of the foregoing background, it is therefore an object of the invention to provide an integrated circuit and associated manufacturing methods including copper interconnections with an effective passivation thereon.

It is another object of the invention to provide an integrated circuit and associated methods including copper interconnections and with an adjacent dielectric layer with a relatively low dielectric constant.

These and other objects, features and advantages in accordance with the present invention are provided by an integrated circuit which in one embodiment comprises a substrate, at least one interconnection layer adjacent the substrate and comprising copper lines, and wherein each of the copper lines comprises at least an upper surface portion including at least one copper fluoride compound. The at least one copper fluoride compound preferably comprises at least one of cuprous fluoride and cupric fluoride. The compounds of copper and fluoride are relatively stable and provide a reliable and long term passivation for the underlying copper.

The integrated circuit may also preferably include a dielectric material on the upper surface portion of the interconnection layer. In accordance with one particularly advantageous embodiment of the invention, the dielectric material may comprise fluorosilicate glass (FSG). During formation of the FSG layer in accordance with one embodiment of the invention, the upper surface of the copper reacts with the fluorine to form the desired stable copper fluoride compound(s) which then acts as a passivation layer for the underlying copper. In accordance with another embodiment, the surface of the copper line is prefluorinated so as to prevent depletion of the fluorine from the FSG layer.

In yet other embodiments, the dielectric material may comprise an oxide, such as silicon dioxide, for example. In yet another embodiment, the dielectric material comprises air.

For a typical integrated circuit, the upper surface portion of the copper line may have a thickness in a range of about 2 nm to 20 nm. In addition, the copper line may have an overall thickness in a range of about 300 nm to 500 nm. Accordingly, the upper copper fluoride portion, which has a higher electrical resistivity than the underlying copper, is only a small percentage of the overall line. This percentage may be less than about 10%, for example.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
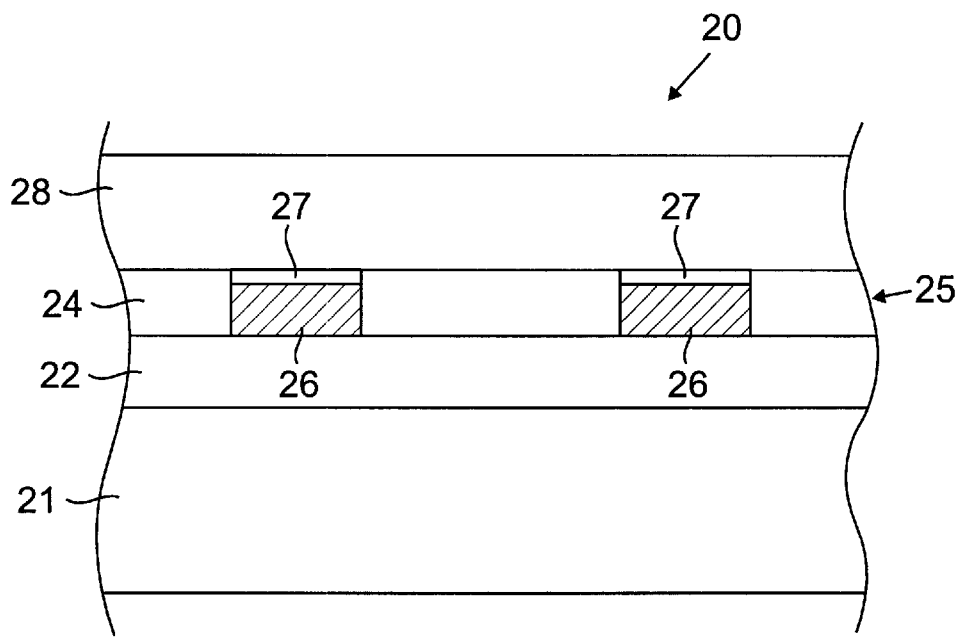
FIG. 1 is a schematic cross-sectional view of an integrated circuit in accordance with the present invention.

Turning now to FIG. 1 an integrated circuit 20 in accordance with the invention is first described. The integrated circuit 20 comprises a semiconductor substrate 21, and an interconnection layer 25 adjacent the substrate. The substrate 21 is preferably a semiconductor substrate including a plurality of active regions therein, not shown, as will be readily appreciated by those skilled in the art. A dielectric layer 22 is illustratively provided between the interconnection layer 25 and the substrate 21.

The interconnection layer 25 includes a plurality of closely spaced conductive lines 26 laterally separated by dielectric portions 24 as will be readily understood by those skilled in the art. The lines 26 interconnect portions of the circuitry of the substrate 21, or provide connections to external circuitry as will be readily appreciated by those skilled in the art. Although only a single interconnection layer 25 is shown with two conductive lines 26 for clarity of explanation, those of skill in the art will appreciate that multiple such interconnection layers, and a large number of conductive lines may be included in typical integrated circuits.

The conductive lines 26 of the interconnection layer 25 preferably comprise copper which provides lower electrical resistance and thus enhanced signal propagation characteristics, for example, as compared to other interconnection materials discussed above in the Background of the Invention section. Each of the conductive lines 26 of the interconnection layer 25 further includes an upper surface portion 27 including at least one copper fluoride compound. As shown in the illustrated embodiment, the integrated circuit 20 also includes a dielectric layer 28 on the interconnection layer 25.

The at least one copper fluoride compound preferably comprises at least one of cuprous fluoride and cupric fluoride. Such compounds of copper and fluorine are relatively easily formed, are relatively stable, and provide a reliable and long term passivation for the underlying copper. Cuprous fluoride may be even more preferred because of its greater stability relative to cupric fluoride. The copper-fluorine bonds are stronger than copper-oxygen bonds, for example, and also stronger then copper-nitrogen bonds. Thus an advantage of the present invention is that a strong bond is formed between the copper and the copper fluoride which further improves reliability.

In accordance with one particularly advantageous embodiment of the invention, the dielectric layer 28 may comprise a fluorosilicate glass (FSG). Accordingly, during formation of the FSG layer, the upper surface of the copper reacts with the fluorine to form the copper fluoride compound(s). The upper surface portion 27 then acts as a passivation layer for the underlying copper. In these embodiments fluorine is depleted from the FSG layer. The method aspects of forming the FSG layer will be described in greater detail below.

In other embodiments, the dielectric layer 28 may comprise an oxide, such as silicon dioxide, for example. In yet another embodiment, the dielectric layer comprises air. To form the air layer, a hollow structure is formed in the integrated circuit 20 as will be readily understood by those skilled in the art.

For typical applications, the upper surface portion 27 of the copper line 26 may have a thickness in a range of about 2 nm to 20 nm. The overall thickness of the copper line 26 may be about 300 nm to 500 nm. Accordingly, the copper fluoride upper surface portion 27, which has a higher electrical resistivity than the underlying copper, is only a small percentage of the overall metal line 26. For example, it is preferred that the upper surface portion 27 including the copper fluoride compound(s) be less than about 10% of the overall thickness. The thickness of the copper fluoride portion 27 is also dependent on thermal budget available during processing as will also be readily understood by those skilled in the art. Thus the desired thickness of the copper fluoride portion 27 is likely to be toward the lower end of the range of 2 nm to 20 nm.

Figure 2:
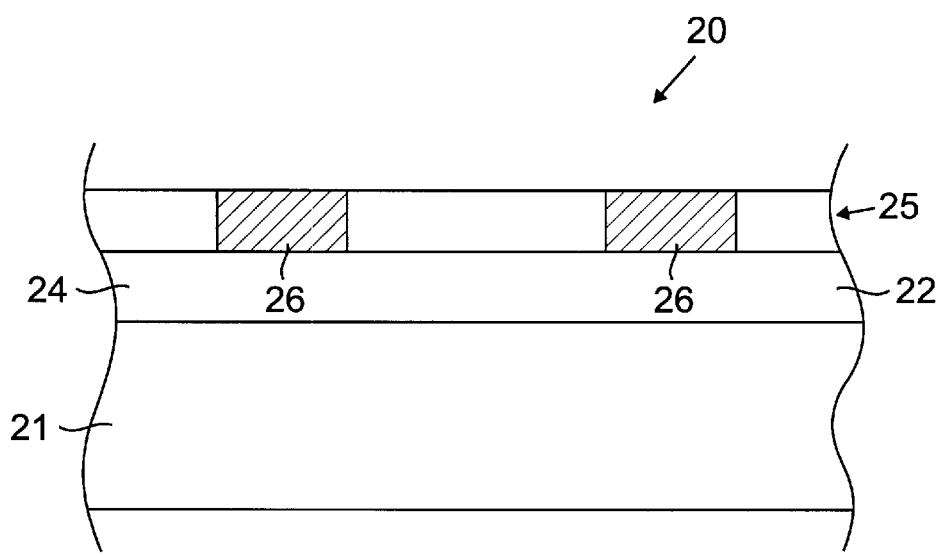
FIGS. 2 and 3 are schematic cross-sectional views of the integrated circuit as shown in FIG. 1 during intermediate steps of a first manufacturing process in accordance with the invention.
Figure 3:
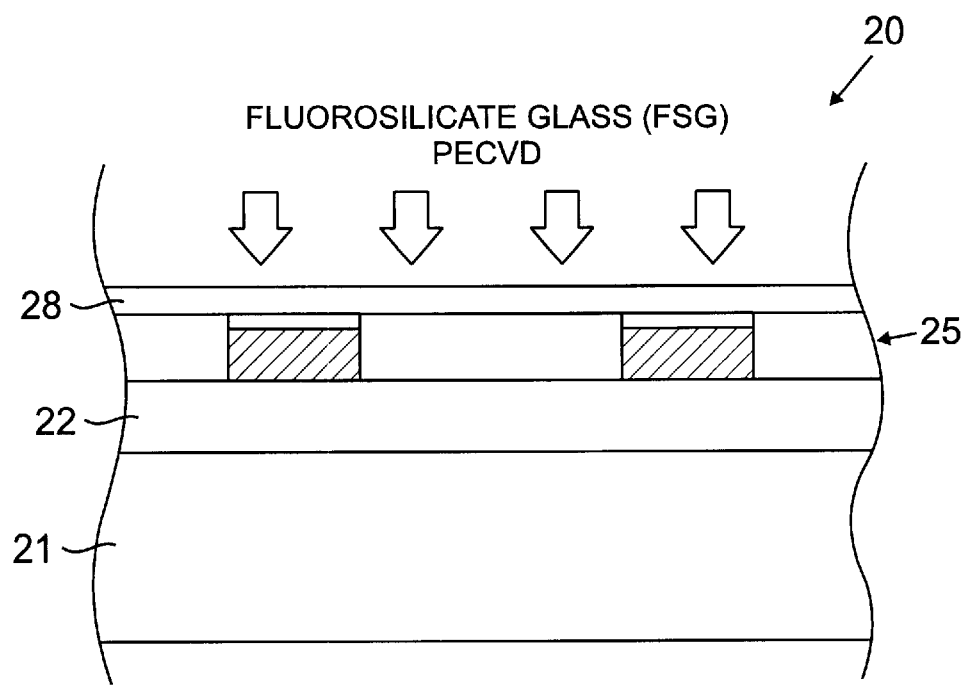

Turning now additionally to FIGS. 2 and 3, a first method for making the integrated circuit 20 is now described. After the substrate 21 is processed to the stage as shown in FIG. 2, that is, with the upper surfaces of the copper lines 26 exposed, an FSG dielectric layer 28 is formed on the interconnection layer 25, including the upper surfaces of the copper lines 26. FIG. 3 schematically illustrates deposition of the FSG layer 28 using conventional plasma enhanced chemical vapor deposition techniques (PECVD) as would be readily understood by those skilled in the art.

The PECVD deposition further has the advantage that the activation from the plasma enhances the formation of the copper-fluorine bonds. The PECVD may also be advantageous because of the temperature constraints required for metallization, that is, that processing temperatures be maintained to less than about 500° C.

The amount of fluorine in the FSG can be graded in the vertical dimension, for example, if desired and as will also be understood by those skilled in the art. The fluorine composition percentage may be up to 10%.

The FSG provides a dielectric layer with a relatively low dielectric constant. For example, silicon dioxide has a dielectric constant of about 4, and the FSG layer may have a dielectric constant of about 3.2 to 3.6, for example. U.S. Pat. No. 5,876,798, for example, discloses further details with respect to forming FSG layers, and the entire disclosure of this patent is incorporated by reference herein.

In the embodiments illustrated in FIGS. 1–3, the FSG layer remains as the dielectric layer 28 in the final integrated circuit 20. However, as will be readily appreciated by those skilled in the art, in other embodiments, the FSG layer may be formed and then removed during intermediate processing so as to be absent in the final integrated circuit. The upper surface of the copper line 26 is still protected by the passivation provided by the copper fluoride upper surface portion 27.

Figure 4:
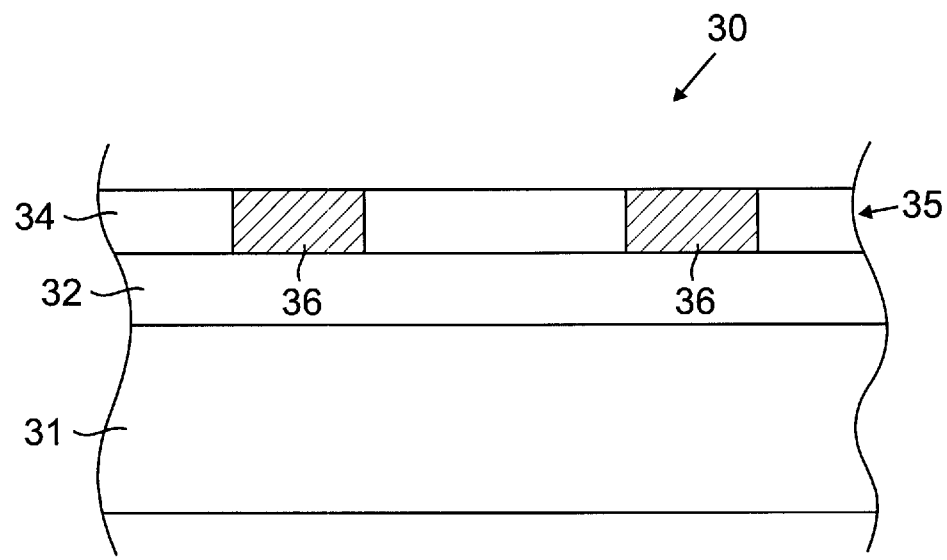
FIGS. 4 and 5 are schematic cross-sectional views of an integrated circuit during intermediate steps of a second manufacturing process in accordance with the invention.
Figure 5:
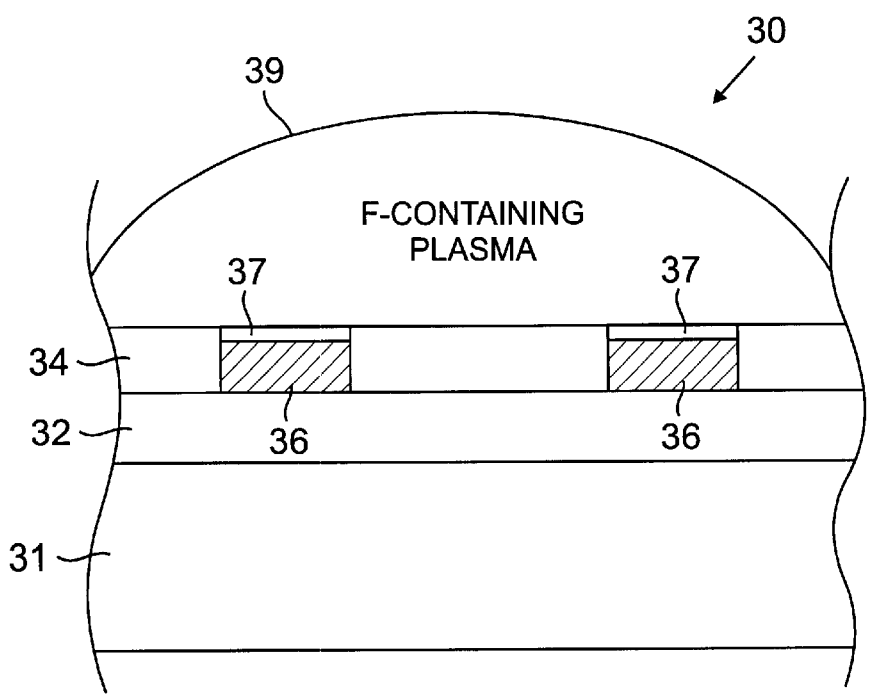

Referring now to FIGS. 4 and 5, an alternate method for making an integrated circuit 30 in accordance with the invention is described. This integrated circuit embodiment includes a substrate 31, a dielectric layer 32 on the substrate, and an interconnection layer 35 on the dielectric layer. The interconnection layer 35 includes the copper lines 36 and dielectric regions 34.

The intermediate structure shown in FIG. 4 is prepared and then exposed to a fluorine-containing plasma 39 (FIG.

5) to thereby treat the surface of the copper lines 36 to form the copper fluoride upper surface portions 37. The plasma treatment can be achieved in conventional plasma reactor, for example, using fluorine-containing gases, at relatively low pressures, on the order of several millitorr, and at flow rates of a few sccm. The power may be about 100–500 watts. The fluorine-containing plasma treatment is a conventional process as will be appreciated by those skilled in the art and requires no further discussion herein. The activation from the-plasma also enhances the formation of the copper-fluorine bonds.

Figure 6:
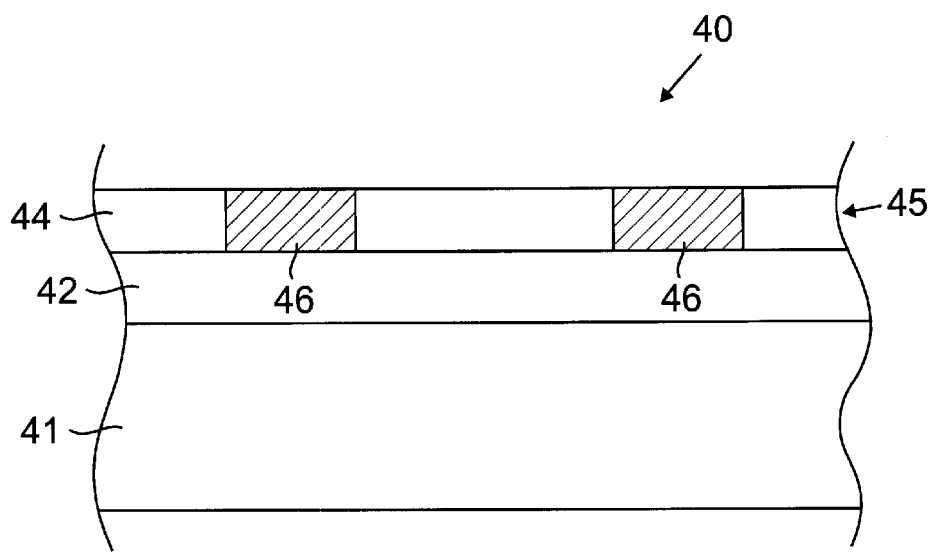
FIGS. 6 and 7 are schematic cross-sectional views of an integrated circuit during intermediate steps of a third manufacturing process in accordance with the invention.
Figure 7:
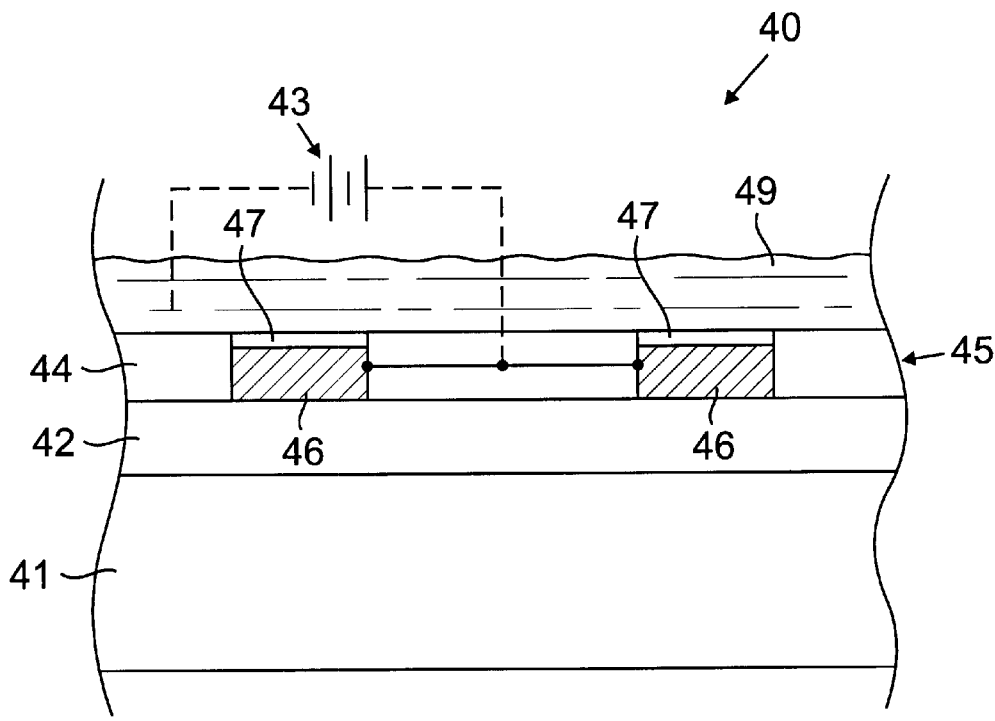

Turning now to FIGS. 6 and 7 an electrochemical deposition technique is described for forming the copper fluoride upper surface portions 47 of the copper lines 46. The integrated circuit 40 includes a substrate 41, a dielectric layer 42 on the substrate, and the interconnection layer 45. The interconnection layer 45 includes the copper lines 46 and the dielectric regions 44. The deposition may also be accomplished by chemical conversion of the surface by exposing the copper to a buffered HF acid solution.

In this embodiment, the intermediate structure as shown in FIG. 6 is placed in an electrolyte solution 49. The electrolyte solution 49 is connected to the illustrated power source 43 to cause the electrochemical deposition of copper fluoride compounds on the upper surface of the copper lines 46 as shown schematically in FIG. 7. As will be readily appreciated by those skilled in the art, the electrochemical treatment is self-regulated by the applied voltage to thereby control the final thickness of the copper fluoride upper surface portions 47.

Figure 8:
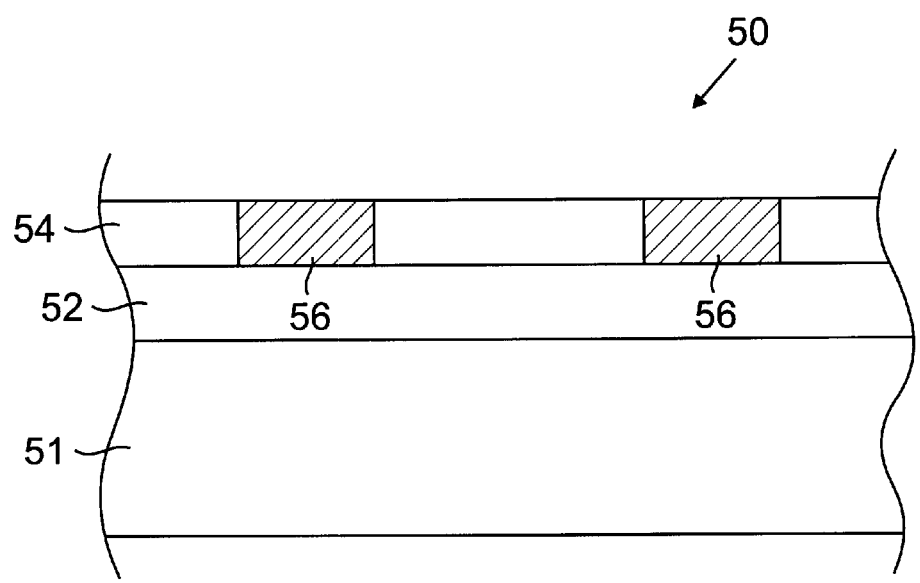
FIGS. 8 and 9 are schematic cross-sectional views of an integrated circuit during intermediate steps of a fourth manufacturing process in accordance with the invention.
Figure 9:
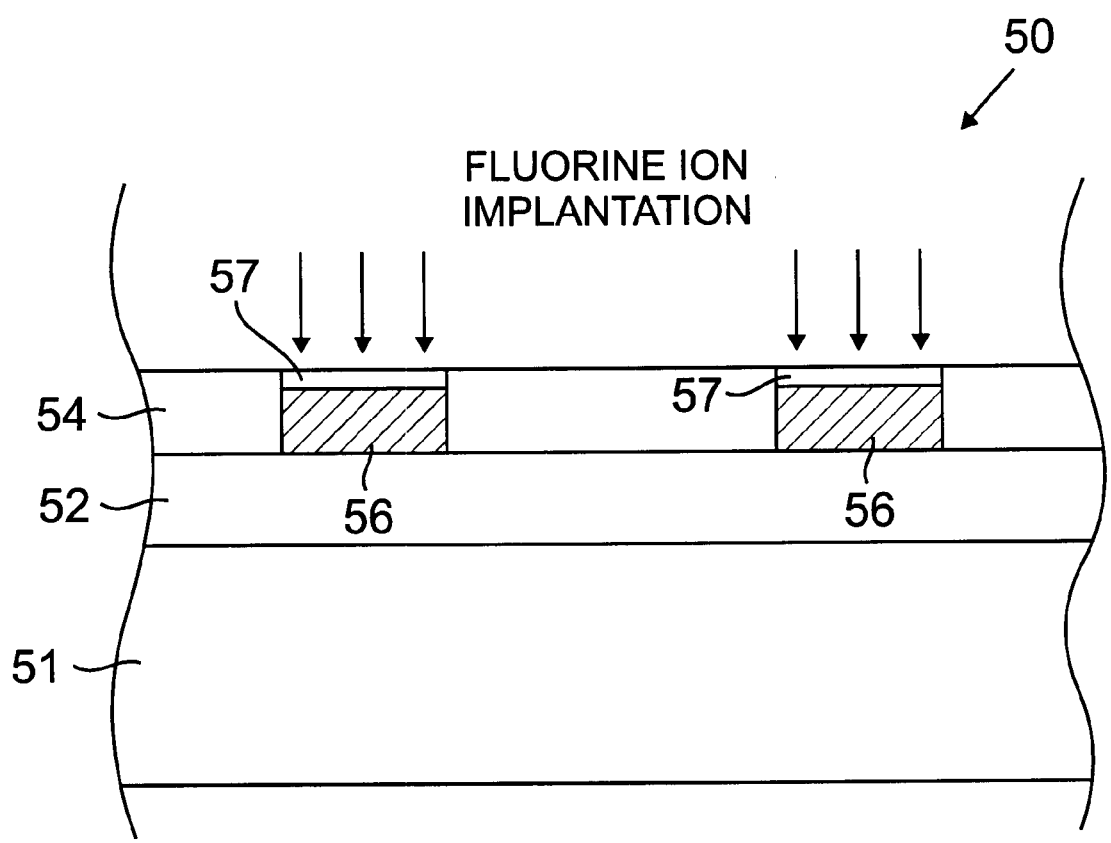

Turning now to FIGS. 8 and 9, yet another embodiment for making the integrated circuit 50 is described. In this embodiment, fluorine ions are implanted into the surface of the copper lines 56. The integrated circuit 50 includes a substrate 51, a dielectric layer 52 on the substrate, and the interconnection layer 55. The interconnection layer 55 includes the copper lines 56 and the dielectric regions 54. The implantation of fluorine ions creates the copper fluoride upper surface portions 57. To form an effective passivation, the ion implantation energy is preferably relatively low, but at a relatively high current or flux to provide low penetration yet high surface concentration as will be readily understood by those skilled in the art.

As will be readily appreciated by those skilled in the art, in other embodiments of the invention, sidewall portions of the copper line, for example, may include the copper fluoride compound(s). In these embodiments, it may be preferred that if the interlevel dielectric layer is FSG, that the copper fluoride compounds be formed first. In other words, prefluorination of the copper line surfaces may be desired so as to avoid depletion of the fluorine from any immediately adjacent portions of an FSG layer, for example, as will be readily appreciated by those skilled in the art. Depletion of fluorine from the FSG may undesirably raise the dielectric constant of the FSG as will be readily appreciated by those skilled in the art. The fluorinated copper surfaces may also enhance compatibility with FSG materials. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making an integrated circuit comprising the steps of:

providing a substrate with an interconnection layer adjacent thereto, the interconnection layer comprising a plurality of copper lines; and forming a passivation layer on at least an upper surface of each copper line opposite the substrate, the passivation layer comprising at least one copper fluoride compound.

2. A method according to claim 1 wherein the at least one copper fluoride compound comprises at least one of cuprous fluoride and cupric fluoride.

3. A method according to claim 1 wherein the step of forming the passivation layer comprises forming a fluorosilicate glass on the upper surface of each copper line to convert an upper surface portion of each copper line into the passivation layer.

4. A method according to claim 3 wherein the step of forming the fluorosilicate glass comprises forming the fluorosilicate glass by chemical vapor deposition.

5. A method according to claim 1 wherein the step of forming the passivation layer comprises treating the upper surface of the copper line with a fluorine-containing plasma to convert an upper surface portion of each copper line into the passivation layer.

6. A method according to claim 1 wherein the step of forming the passivation layer comprises forming the passivation layer by electrochemical deposition.

7. A method according to claim 1 wherein the step of forming the passivation layer comprises implanting fluorine ions into an upper surface portion of each copper line.

8. A method according to claim 1 further comprising the step of forming a dielectric layer on an upper surface of the interconnection layer.

9. A method according to claim 8 wherein the dielectric layer comprises a fluorosilicate glass layer formed after forming of the at least one copper fluoride compound so that fluorine is not depleted from the fluorosilicate glass layer.

10. A method according to claim 9 wherein the fluorosilicate glass has a percentage composition of fluorine of up to about 10%.

11. A method according to claim 8 wherein the dielectric layer comprises an oxide.

12. A method according to claim 8 wherein the dielectric layer comprises air.

13. A method according to claim 1 wherein the passivation layer has a thickness in a range of about 2 nm to 20 nm.

14. A method according to claim 13 wherein each copper line has a thickness in a range of about 300 nm to 500 nm.

15. A method for making an integrated circuit comprising the steps of:

providing a substrate with an interconnection layer adjacent thereto, the interconnection layer comprising a plurality of copper lines;

forming a fluorosilicate glass layer on an upper surface portion of the interconnection layer so that an upper surface portion of each copper line is converted into a passivation layer comprising at least one copper fluoride compound.

16. A method according to claim 15 wherein the at least one copper fluoride compound comprises at least one of cuprous fluoride and cupric fluoride.

17. A method according to claim 15 wherein the step of forming the fluorosilicate glass layer comprises forming the fluorosilicate glass layer using chemical vapor deposition.

18. A method according to claim 15 wherein the fluorosilicate glass layer has a percentage composition of fluorine of up to about 10%.

19. A method according to claim 15 wherein the passivation layer has a thickness in a range of about 2 nm to 20 nm.

20. A method according to claim 19 wherein each copper line has a thickness in a range of about 300 nm to 500 nm.

21. A method for making an integrated circuit comprising the steps of:
- providing a substrate with an interconnection layer adjacent thereto, the interconnection layer comprising a plurality of copper lines;
- forming a passivation layer on surfaces of each copper line and comprising at least one copper fluoride compound; and
- forming a fluorosilicate glass layer adjacent the interconnection layer after forming the at least one copper fluoride compound so that fluorine is not depleted from the fluorosilicate glass layer.

22. A method according to claim 21 wherein the at least one copper fluoride compound comprises at least one of cuprous fluoride and cupric fluoride.

23. A method according to claim 21 wherein the fluorosilicate glass has a percentage composition of fluorine of up to about 10%.

24. A method according to claim 21 wherein the passivation layer has a thickness in a range of about 2 nm to 20 nm.

25. A method according to claim 21 wherein each copper line has a thickness in a range of about 300 nm to 500 nm.

* * * * *